United States Patent [19]

Kobayashi et al.

[11] 4,186,006

[45] Jan. 29, 1980

[54] METHOD FOR DEVELOPING A LITHOGRAPHIC PRINTING PLATE

[75] Inventors: Kesanao Kobayashi; Hiroshi Matumoto; Yasuhisa Naritomi, all of Shizuoka, Japan

[73] Assignee: Fuji Photo Film Co., Ltd., Minami-ashigara, Japan

[21] Appl. No.: 839,058

[22] Filed: Oct. 3, 1977

[30] Foreign Application Priority Data

Oct. 1, 1976 [JP] Japan ................................ 51-118216

[51] Int. Cl.$^2$ .......................... G03F 7/02; G03C 1/58; G03C 1/52
[52] U.S. Cl. .................................... 430/302; 430/309; 430/331; 430/141
[58] Field of Search ............................... 96/33, 49, 75

[56] References Cited

U.S. PATENT DOCUMENTS 3,891,439  6/1975  Katz ......................................... 96/49
3,954,472  5/1976  Walls ........................................ 96/49

FOREIGN PATENT DOCUMENTS 77401 of 1976 Japan .......................................... 96/33

OTHER PUBLICATIONS

C.A. vol. 75, 1971, 103716r.

*Primary Examiner*—Mary F. Kelley
*Attorney, Agent, or Firm*—Sughrue, Rothwell, Mion, Zinn and Macpeak

[57] ABSTRACT

A method for developing a light-sensitive lithographic printing plate having an image-forming layer containing a substantially water-insoluble diazo resin thereon using a developer composition which comprises (a) benzyl alcohol, α-methylbenzyl alcohol, ethylene glycol monophenyl ether and/or ethylene glycol monobenzyl ether, (b) an anionic surface active agent and (c) a water-soluble sulfite.

23 Claims, No Drawings

METHOD FOR DEVELOPING A LITHOGRAPHIC PRINTING PLATE

BACKGROUND OF THE INVENTION

1. Field of the Invention

This invention relates to a method for developing light-sensitive lithographic printing plates. More particularly it is concerned with a method for removing unexposed areas formed in a light-sensitive lithographic printing plate by imagewise application of actinic radiation thereon using a developer composition.

2. Description of the Prior Art

In a lithographic printing plate, oleophilic image areas materially corresponding to an image to be printed and hydrophilic nonimage areas are formed in the same plane. The oleophilic image areas are ink-receptive and water-repellent, whereas the hydrophilic nonimage areas are water-receptive and greasy ink-repellent. An ink pattern is transferred directly or through a blanket to a paper.

In order to photographically form an image, presensitized (PS) plates and wipe-on plates are widely used as light-sensitive lithographic printing plates for photoengraving. These plate materials can be classified as additive type materials in which an emulsion lacquer is coated to reinforce the image after development and subtractive type materials in which a light-sensitive layer having the desired abrasion resistance is previously provided and nonimage areas are selectively removed at development. Developers of the present invention are mainly used in the latter subtractive type materials. In printing plate materials of the latter subtractive type in which diazo resins are used as photosensitive materials, hydrophobic resins are usually used as binders.

A light-sensitive composition is thinly coated on a support having a hydrophilic surface. When the light-sensitive composition thus coated is imagewise exposed through a transparent negative film, only the exposed areas harden and become solvent-insoluble in contrast with the unexposed areas. This leads to a difference in properties with respect to solvents between the exposed areas and the unexposed areas. By utilizing this difference, an image pattern on the exposed areas alone is selectively formed on the hydrophilic surface of the support whereby a printing plate is obtained.

The hardening of diazo resins coated on the exposed areas, however, is insufficient. Usually, when the diazo resin is immersed in a solvent for use in coating the light-sensitive composition, a large portion of the cured resin is dissolved in the solvent or is severely swollen and removed to such an extent that only the diazo decomposition products on the exposed areas remain on the surface of the support. Such printing plates have no practical use. Therefore, it is desired for a developer for a lithographic printing plate, which is made from a light-sensitive composition comprising a diazo resin and a hydrophobic resin, to thereby increase as much as possible the difference in solubility or degree of swelling between the exposed areas and the unexposed areas. That is to say, desirable developer compositions are those which remove completely the unexposed areas and do not deteriorate at all the printing capability of the exposed areas.

The developer as described above must also be capable of development completion in a short period of time. Recently the need for this characteristic has been increasing as automatic developing machines become more widely used. The reason for this is that since an automatic developing machine is designed so that a large number of plate materials can be processed in a short period of time, the developing conditions are always constant and it is not possible to vary the time of development and the strength of rubbing unlike the case in which development is carried out by flowing a developer on a printing plate and manually rubbing the surface.

Conditions under which a developer is used markedly vary. For example, the developer is used at temperatures of less than about 10° C. in cold areas in the winter. Insufficient development is not acceptable even under these conditions. If there is any residue on the unexposed areas, ink will adhere at the time of printing, scumming the background of the print. Similarly, a lapse of several months from the production of printing plates tends to cause scumming to be formed.

Therefore, development has long been desired with those developers which meet the above requirement and, furthermore, which minimize or eliminate problems in the working environment such as pollution due to waste developer, odor, working sanitation, etc., problems of hazards in transfer, storage, etc., problems of production cost, etc.

An aqueous solution type developer containing an anionic type surface active agent, benzyl alcohol and an alkali agent has been proposed in Japanese Patent Application (OPI) No. 77401/1976. While this developer has satisfied substantially all of the above requirements and achieved commercial success, it has the disadvantage in that where a printing plate material is developed with the developer after a lapse of several months from the production of the printing plate material, unfavorable conditions arise, resulting in the formation of scumming.

U.S. Pat. No. 3,954,472 describes an aqueous developer comprising an alcohol, ammonium sulfite and polyvinyl pyrrolidone for use in negative type subtractive light-sensitive lithographic printing plates. With a printing plate produced using this developer composition, no scumming is formed in the nonimage areas, but its resistance to printing is insufficient as compared with a printing plate developed with a developer composition described, for example, in Japanese Patent Application (OPI) No. 77401/1976. Furthermore, it is considered that since a large amount of water-soluble low boiling point alcohols such as n-propyl alcohol and the like are present in the developer described in a specific example of U.S. Pat. No. 3,954,472, problems of working sanitation, hazards and pollution arise due to odor and the relatively low flash point of n-propyl alcohol and the like.

SUMMARY OF THE INVENTION

An object of the present invention is to provide an improved method of development for removing the nonimage areas of a lithographic printing plate in which a substantially water-insoluble light-sensitive diazo resin is used as a light-sensitive material.

Other objects of the present invention and advantages will become apparent from the following detailed description.

It has now been found that these objects are attained by a method of development using a developer composition comprising an aqueous solution of (a) benzyl alcohol, α-methylbenzyl alcohol, ethylene glycol monophenyl ether and/or ethylene glycol monobenzyl ether, (b) an anionic surface active agent and (c) a water-soluble sulfite. This developer composition has the capability of removing selectively and substantially completely the unexposed areas without reducing the adhesion of the cured light-sensitive composition at the exposed areas to the hydrophilic layer thereunder.

Accordingly, the present invention provides a method of developing an imagewise exposed light-sensitive lithographic printing plate having thereon an image-forming layer containing a substantially water-insoluble diazo resin which comprises treating the lithographic printing plate with a developer composition comprising an aqueous solution of (a) benzyl alcohol, α-methylbenzyl alcohol, ethylene glycol monophenyl ether and/or ethylene glycol monobenzyl ether, (b) an anionic surface active agent and (c) a water-soluble sulfite.

DETAILED DESCRIPTION OF THE INVENTION

Hitherto, as a negative-type diazo component for a lithographic printing plate, a condensate of a diphenylamine p-diazonium salt, i.e., the reaction product of a diazonium salt and an organic condensing agent containing a reactive group, e.g., aldol or acetal, and formaldehyde as described in U.S. Pat. Nos. 2,063,631 and 2,667,415, or the like have been used.

Other useful condensable diazo compounds are described in British Pat. Nos. 1,312,925 and 1,312,926, U.S. Pat. No. 3,679,419, etc. These diazonium salt condensates are called diazo resins.

Since these light-sensitive diazo resins are usually synthesized in the form of an inorganic salt and they are water-soluble and have low solubility in organic solvents, it is difficult to coat solutions of such diazo resins and hydrophobic resins in organic solvents. Furthermore, since the diazo resins tend to be influenced by moisture, a light-sensitive lithographic printing plate prepared by coating an aqueous solution thereof has low stability and is not commercially of great value.

A light-sensitive lithographic printing plate produced using a substantially water-insoluble light-sensitive diazo resin; that is, the reaction product obtained by reacting the above described water-soluble diazo resin with an aromatic or aliphatic compound containing one or more phenolic hydroxy groups or sulfonic acid groups or both such groups according to the method described in British Pat. No. 1,280,885 gives good results.

Suitable examples of reactants containing a phenolic hydroxy group include hydroxybenzophenone, 4,4-bis(4'-hydroxyphenyl)pentanoic acid, resorcinol, diphenolic acids such as diresorcinol and the like. These compounds may be substituted. The term hydroxybenzophenone includes 2,4-dihydroxybenzophenone, 2-hydroxy-4-methoxybenzophenone, 2,2'-dihydroxy-4,4'-dimethoxybenzophenone and 2,2',4,4'-tetrahydroxybenzophenone. Preferred sulfonic acids include aromatic sulfonic acids such as the sulfonic acids of benzene, toluene, xylene, naphthalene, phenol, naphthol, benzophenone, and the like, and their water soluble salts such as the ammonium and alkali metal salts. Sulfonic acid group-containing compounds may be substituted by a lower alkyl group, a nitro group, a halogen and another sulfonic acid group.

Suitable examples of these sulfonic acid group-containing compounds are benzenesulfonic acid, toluenesulfonic acid, naphthalenesulfonic acid, 2,5-dimethylbenzenesulfonic acid, sodium benzenesulfonate, naphthalene-2-sulfonic acid, 1-naphthol-2(or 4)-sulfonic acid, 2,4-dinitro-1-naphthol-7-sulfonic acid, 2-hydroxy-4-methoxybenzophenone-5-sulfonic acid, sodium m-(p'-anilinophenylazo)benzenesulfonate, alizarinsulfonic acid, o-toluidine-m-sulfonic acid, ethanesulfonic acid, and the like.

Sulfonic acid esters of alcohols and salts thereof are also useful. These compounds are available as anionic surface active agents. Representative examples of these anionic surface active agents are ammonium or alkali metal salts of lauryl ether sulfate, alkylaryl sulfates, p-nonylphenol sulfate, 2-phenylethyl sulfate, isooctylphenoxydiethoxyethyl sulfate and the like.

These substantially water-insoluble diazo resins are precipitated by mixing an aqueous solution of a diazo resin and an aqueous solution of the reactant set forth above, preferably in equal molar amounts. The reaction product thus precipitated is coated on a suitable lithographic support using conventional methods as described in U.S. Pat. No. 3,300,309 and thus a light-sensitive lithographic printing plate is obtained.

Examples of hydrophobic resins which are used in combination with the substantially water-insoluble diazo resins include a number of resins which are known and used in other technical fields. Whether or not these hydrophobic resins can be used in the present invention greately depends upon the conditions required for production of lithographic printing plates. As a matter of course, these hydrophobic resins are must be oleophilic so that they provide ink-receptivity, must be soluble in ordinary organic solvents and must have physical or chemical affinity to light-sensitive diazo resins which are slightly or insoluble in water, and must have a film forming capability. It is desirable for the resins to have excellent affinity to ink and have a certain hardness and bending properties so that it is possible to duplicate several tens of thousands to several hundreds of thousands of copies.

Examples of resins satisfying the above requirements include epoxy resins, polyamide resins, polyvinyl halides, particularly polyvinyl chloride, polyvinylidene chloride, chlorinated polyolefins, polyvinyl acetate, acetal resins such as formal resins, butyral resins and the like, soluble urethane resins such as those commercially available under the trade name of Esthane by Goodrich Co., Ltd., polystyrene-maleic anhydride copolymers, the half esters and the half amides thereof, cellulose derivatives, shellac, rosin or modified rosin, acrylic acid-acrylate copolymers, copolymers of hydroxyalkyl acrylate or methacrylate and acrylonitrile or methacrylonitrile copolymers which copolymers have an acid value of 10 to 100 as described in W. German Patent Application (OLS) No. 2,508,618 particularly 2-hydroxyethyl methacrylate, acrylonitrile, methyl methacrylate, and methacrylic acid copolymers, and mixtures thereof.

A water-insoluble diazo resin and a hydrophobic resin described above are dissolved in a lower alcohol, a glycol ether, dialkylformamide, a chlorinated solvent or mixed solvent thereof. The resulting solution is, if desired, colored with a dye or pigment, and in some cases, other additives such as plasticizers, colorants capable of coloring the light-sensitive layer upon exposure, stabilizers and the like are added thereto. The thus obtained solution is coated on a support having a hydrophilic surface as described in U.S. Pat. No. 3,280,734 and British Pat. No. 1,069,283. Various coating methods are known and conventional coating methods can be used to coat the thus-obtained solution on the support. A suitable amount of the light-sensitive substantially water insoluble diazo resin in the light-sensitive layer on a dry basis is about 5 to about 50% by weight, preferably 8 to 20% by weight, and a suitable amount of the hydrophobic resin in the light-sensitive layer on a dry basis is about 95 to about 50% by weight, preferably 92 to 80% by weight.

Suitable supports which can be used are those dimensionally stable plates which have been hitherto used as supports for printing plates. Examples of these supports include paper, synthetic resin (for example, polyethylene, polypropylene, polystyrene, and the like) laminated paper, plates of metals such as aluminum (including aluminum alloys), zinc, iron, copper, and the like, films of synthetic resins such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal, and the like, the above described metals laminated or vapor-deposited on a paper or a synthetic resin film, etc. Of these, an aluminum plate and a composite sheet in which an aluminum sheet is provided on a polyethylene terephthalate film as described in Japanese Patent Publication No. 18327/1973 are preferred.

The support is, in general, subjected to a treatment to render the surface of the support hydrophilic. There are various kinds of treatments to render the surface hydrophilic. For example, in the case of a support with a synthetic resin surface, the so-called surface treatments such as a chemical treatment, a corona discharge treatment, a flame treatment, an ultraviolet light treatment, a high frequency treatment, a glow discharge treatment, an active plasma treatment, a laser treatment, and the like as described in, for example, U.S. Pat. Nos. 2,764,520 3,497,407, 3,145,242, 3,376,208, 3,072,483, 3,475,193, 3,360,448, and British Pat. No. 788,365, and a method comprising coating an undercoating layer on the synthetic resin surface after the above surface-treatment can be employed.

With a support having a metal surface, particularly an aluminum surface, preferably a surface treatment such as a graining treatment such as sand-graining, an immersion treatment using an aqueous solution of sodium silicate e.g., as described in U.S. Pat. No. 2,714,066, potassium fluorozirconate, e.g., as described in U.S. Pat. No. 2,946,683, a phosphate e.g., as disclosed in U.S. Pat. Nos, 3,030,212 and 3,808,000, or the like, or an anodic oxidation treatment is employed e.g., as described in U.S. Pat. Nos. 3,030,212 and 3,808,000. An aluminum plate subjected to an immersion treatment using a solution of sodium silicate in water after graining as described in U.S. Pat. No. 2,714,066, and an aluminum plate subjected to an immersion treatment using a solution of an alkali metal silicate in water after an anodic oxidation treatment as described in U.S. Pat. No. 3,181,461 are preferably used. The above anodic oxidation treatment can be carried out by passing an electric current through an electrolyte comprising one or more aqueous or non-aqueous solutions of inorganic acids such as phosphoric acid, chromic acid, sulfuric acid, boric acid, and the like, or organic acids such as oxalic acid, sulfamic acid, and the like, or the salts thereof, using an aluminum plate as the anode.

Silicate electro-deposition as described in U.S. Pat. No. 3,658,662 is also useful.

These treatments to render the surface hydrophilic are carried out in order to prevent adverse interactions between the surface of the support and the light-sensitive composition provided on the surface of the support, and to increase the adhesion of the light-sensitive layer to the surface as well as to render the surface of the support hydrophilic.

The amount of component (a), the benzyl alcohol, α-methylbenzyl alcohol, ethylene glycol monophenyl ether and/or ethylene glycol monobenzyl ether, in the developer composition used in the method of the present invention is suitably about 0.5 to about 15% by weight, more preferably 1 to 5% by weight. Benzyl alcohol is preferred as component (a).

Anionic surface active agents which can be used as component (b) in the method of the present invention include higher alcohol (e.g., having 8 to 22 carbon atoms) sulfuric acid ester salts, e.g., sodium lauryl alcohol sulfate, sodium octylalcohol sulfate, ammonium lauryl alcohol sulfate, "Teepol B-81" (trade name; produced by Shell Co.) secondary sodium alkyl sulfates, and the like; aliphatic alcohol phosphoric acid ester salts, e.g., the sodium salt of cetyl alcohol phosphate and the like; alkylaryl sulfonic acid salts, e.g., sodium dodecylbenzenesulfonate, sodium isopropylnaphthalene sulfonate, sodium dinaphthalenedisulfonate, sodium methanitrobenzene sulfonate, and the like; alkylamide sulfonic acid salts, e.g.,

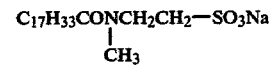

and the like; dibasic aliphatic acid ester sulfonic acid salts, e.g., sodium sulfosuccinic acid dioctyl ester, sodium sulfosuccinic acid dihexyl ester and the like; and the like. Of these compounds, sodium isopropylnaphthalene sulfonate ("Aerosol OS", tradename, produced by Americal Cyanamide Co.) is preferred in that it is effective in a small amount when used in combination with benzyl alcohol, α-methylbenzyl alcohol, ethylene glycol monophenyl ether and/or ethylene glycol monobenzyl ether.

The amount of the anionic surface active agents present in the developer composition used in the method of this invention suitably ranges from about 0.1 to about 5% by weight, more preferably from 0.5 to 1.5% by weight. Below about 0.1% by weight, the effect is not obtained, whereas above about 5% by weight, the developing capability is excessive, causing several problems. For example, a dye or pigment contained in the light-sensitive composition as a colorant is eluted from the image area during development. Furthermore, printing-durability of the lithographic printing plate obtained is deteriorated.

Sulfites as component (c) in the developer composition used in the method of the present invention dissolve the waterinsoluble diazo resins as aqueous solutions of the sulfites. Particularly, in developing a lithographic printing plate comprising a light-sensitive layer in combination with a hydrophobic resin, scum-free printing plates can be obtained by the use of a plate after a lapse of a long period of time from the production of the plate. Useful sulfites are alkali metal, e.g., sodium, potassium and lithium, salts and alkaline earth metal, e.g., magnesium etc. salts, etc. The proportion of the sulfite ranges from about 0.05 to about 3% by weight, preferably from 0.1 to 0.5% by weight, of the developer composition used in the method of this invention. Since the sulfites are unstable in a pH range of less than about 4.5, it is desirable that they are used in a pH range of more than about 5. Although ammonium salts may be used in the present invention, because ammonium salts have low stability, the formation of ammonia odor is detected when the developer composition is used in an automatic developing machine. Therefore, sodium and potassium salts are easier to handle and are preferred. The sodium salts are particularly preferred.

The developer composition used in the method of the present invention can contain, if desired, alkali agents. Useful alkali agents are inorganic alkali agents such as sodium silicate, potassium silicate, potassium hydroxide, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate, ammonium carbonate and the like; organic alkali agents such as mono-, di-, tri-ethanolamine, propanolamine; organic ammonium silicates such as ethanol amine silicate, and the like. The proportion of the alkali agent in the developer composition used in the present invention ranges from about 0.05 to about 3% by weight, preferably from 0.1 to 2% by weight of the developer composition. Below about 0.05% by weight, the effect cannot be obtained, and above about 3% by weight, the print run life of the lithographic printing plate is undesirably reduced.

In the method of this invention, an imagewise exposed light-sensitive lithographic printing plate is simply brought into contact with a developer composition described above e.g., using a PS plate automatic developing machine, a developing tray, a tank or absorbent cotton soaked with the developer, and at the same time, mechanically rubbed, whereby the unexposed areas of the light-sensitive layer can be completely removed after a lapse of about 20 to about 30 seconds without exerting any adverse influence on the exposed areas of the light-sensitive layer. A suitable development temperature can range from about 5° to about 80° C., preferably 10° to 30° C.

The following examples are given to illustrate the present invention in greater detail,. Unless otherwise indicated herein all parts, percents, ratios and the like are by weight.

EXAMPLE 1

To 300 g of dioxane heated to 100° C. in a stream of nitrogen was drop-wise added a mixed solution of 150 g of 2-hydroxyethyl methacrylate, 60 g of acrylonitrile, 79.5 g of methyl methacrylate, 10.5 g of methacrylic acid and 1.2 g of benzoyl peroxide over a period of 2 hours. After the addition was completed, the resulting solution was diluted with methanol and poured into water to precipitate a copolymer. This copolymer was vacuum-dried at 70° C. The acid value of the thus obtained 2-hydroxyethyl methacrylate copolymer (I) was 20. The viscosity of a 33% ethylene glycol monomethyl ether solution of Copolymer (I) at 25° C. was 4,500 cps.

A 2S aluminum plate of a thickness of 0.15 mm was immersed in a 10% aqueous solution of sodium tertiary phosphate maintained at 80° C. for 30 seconds to degrease the plate. This aluminum plate was sand-grained with a nylon brush while flowing a pumice slurry thereover. Thereafter, the aluminum plate was etched using sodium aluminate maintained at 60° C. for 10 seconds and then washed with a 3% aqueous solution of sodium hydrogensulfate.

Thus prepared aluminum plate was subjected to an anodic oxidation in a 20% sulfuric acid aqueous solution at a current density of 2 A/dm$^2$ for 2 minutes and then processed with a 2.5% aqueous solution of sodium silicate maintained at 70° C. for 1 minute to produce an anodically-oxidized Aluminum Plate (I).

On this Aluminum Plate (I) was coated the following light-sensitive composition. Drying was conducted at 100° C. for 2 minutes.

| | |
|---|---|
| 2-Hydroxyethyl Methacrylate Copolymer (I) | 0.87 g |
| 2-Methoxy-4-hydroxy-5-benzoyl-benzenesulfonic Acid Salt of the Condensate of p-Diazodiphenylamine and Paraformaldehyde | 0.1 g |
| Oil Blue #603 (produced by Orient Chemical Industry Co., Ltd.) | 0.03 g |
| 2-Methoxyethanol | 6 g |
| Methanol | 6 g |
| Ethylene Dichloride | 6 g |

The dry coating amount was 2.1 g/m$^2$. This light-sensitive lithographic printing plate was imagewise exposed for 45 seconds to light from a 30 A carbon arc lamp at a distance of 70 cm and immersed in a developer having the following composition for 1 minute at 25° C.

| | |
|---|---|
| Sodium Sulfite | 3 g |
| Benzyl Alcohol | 30 g |
| Triethanolamine | 20 g |
| Monoethanolamine | 5 g |
| Pelex NBL (t-Butylnaphthalene-sulfonic Acid Sodium Salt produced by Kao Atlas Co., Ltd.) | 30 g |
| Water to make | 1000 ml |

Then the surface of the printing plate was lightly rubbed with absorbent cotton and washed with flowing water, and thus a lithographic printing plate was obtained.

The thus obtained printing plate was mounted on a Heidelberg GTO printing machine, and when high quality paper was printed, 120,000 sheets of scum-free, beautiful prints were obtained.

A printing plate material produced as described above was stored for 9 months and then was exposed, developed and printed in the same manner as described above. With this printing plate material, no change in printing durability and scumming was detected in comparison with the printing plate just after production thereof.

EXAMPLE 2

Six light-sensitive lithographic printing plates as described in Example 1 were stored for 14 months from the production thereof and were then exposed under the same conditions as described in Example 1.

Three printing plates were developed for 1 min at 25° C. with a developer having the following composition in a presensitized printing plate automatic developing machine (Plano PS processor—1300 RU produced by Fuji Photo Film Co., Ltd.).

| Benzyl Alcohol | 600 g |
| Sodium Silicate (40% aq. soln.) | 200 g |
| Sodium Isopropylnaphthalene-sulfonate | 600 g |
| Potassium Sulfite | 80 g |
| Water | 19 liters |

After the development, a gum arabic 7° Be' aqueous solution was coated thereon. The printing plates were mounted on a Heidelberg KOR-D printing machine, and when printing was conducted, sharp prints were obtained.

COMPARATIVE EXAMPLE

The remaining three printing plates exposed in Example 2 were developed with a developer having the composition shown below (prepared by the method described in Japanese Patent Application (OPI) No. 77401/1976) in the same presensitized printing plate automatic developing machine under the same conditions as employed in Example 2.

| Benzyl Alcohol | 600 g |
| Sodium Silicate (40% aq. soln.) | 200 g |
| Sodium Isopropylnaphthalene-sulfonate | 600 g |
| Water | 19 liters |

After the development, a gum arabic 7° Be' aqueous solution was coated thereon. These printing plates were mounted on a Heidelberg KOR-D printing machine, and when printing was conducted, prints having the background toned with ink were obtained. Even after 5,000 sheets were printed, scumming still took place.

EXAMPLE 3

| Potassium Sulfite | 5 g |
| Benzyl Alcohol | 45 g |
| Monoethanolamine | 20 g |
| Pelex NBL | 2 g |
| Water | 950 ml |

Light-sensitive printing plates produced as described in Example 2 developed with a developer for 1 min at 25° C. having the above composition gave the same results as obtained in Example 2.

EXAMPLE 4

An aluminum plate mechanically grained was immersed in a 2% aqueous solution of sodium silicate ($SiO_2/Na_2O$ molar ratio: 3.2) heated to 70° for 1 minute to form thereon a permanent hydrophilic layer. On this permanent hydrophilic layer was coated the light-sensitive composition shown below.

| Terpolymer of Caprolactam, Hexamethylenediamine Adipate and 4,4-Diaminodicyclohexylmethane Adipate (Ultramid IC, produced by BASF Co.; melting point; 185° C., glass transition temperature; 35° C., density; 1.11 g/cm³) | 25 g |
| Reaction Product of Diazo Resin produced by Condensation of p-Diazodiphenylamine and Formaldehyde, and p-Tolulenesulfonic Acid | 25 g |
| Oil Blue #603 | 1 g |
| Methanol | 500 g |
| Ethylene Dichloride | 500 g |
| Methylglycol | 500 g |

The thus obtained light-sensitive printing plate was imagewise exposed using a Berky Ascor Printer produced by Berky Photo Inc. for 1 minute.

This plate was developed with a developer having the following composition. The development was conducted for 1 min at room temperature (about 20°–30° C.).

| Benzyl Alcohol | 10 g |
| Monogen Y-100 (sodium lauryl-sulfate produced by Daiichi Kogyo Seiyaku Co., Ltd.) | 40 g |
| Sodium Sulfite | 1 g |
| Water | 920 ml |

The thus obtained printing plate was mounted on a Heidelberg GTO printing machine, and even after 30,000 sheets of paper were printed, no formation of toning and spotlike scummping took place.

A printing plate was produced by developing for 1 min at a developing temperature cooled to 10° C. With the thus obtained printing plate, the printing could be carried out in the same manner as above.

EXAMPLE 5

| Polyvinyl Formal #100 (produced by Kanto Denka Kogyo Co., Ltd.) | 260 g |
| Phthalocyanine Blue CI Blue 15 | 65 g |
| Ethylene Dichloride | 1800 g |

These components were dispersed in a ball mill to prepare a solution. This solution in an amount of 22.5 g and 0.7 g of the same diazo resin as used in Example 1 were dissolved in 325 g of ethylene dichloride, 40 g of methanol and 10 g of furfuryl alcohol. The resultant solution was coated on the same type of aluminum plate as described in Example 4.

The thus obtained light-sensitive lithographic printing plate was imagewise exposed for 20 seconds using a Berky Ascor Printer and then developed for 1 min at 25° C. with a developer having the following composition.

| Benzyl Alcohol | 30 g |
| Aerosol OS (sodium isopropyl-naphthalene sulfonate, produced by American Cyanamide Co.) | 30 g |
| Lithium Sulfite | 1 g |
| Water | 950 ml |

The non-image areas were removed in a film form by lightly rubbing with absorbent cotton. A printing plate with a 7° Be' gum arabic aqueous solution coated thereon was mounted on a Heidelberg GTO printing machine and 10,000 sheets of paper were printed. However, no formation of toning and spotlike scumming took place, and uniform sharp prints were obtained.

EXAMPLE 6

In 100 g of methylglycol were disolved 30 g of the same diazo resin as described in Example 1 and 10 g of Epon #1031 *(produced by Shell Chemical Corporation). The resultant solution was coated on the same type of support as described in Example 4. The thus obtained plate was imagewise exposed and developed for 1 min at 25° C. with a developer having the following composition.

* Epon #1031: Tetrakis(hydroxyphenyl)ethane Tetraglycidyl Ether

| | |
|---|---|
| Benzyl Alcohol | 200 g |
| Neogen P (sodium alkylbenzenesulfonate, produced by Dai-ichi Kogyo Seiyaku Co., Ltd.) | 100 g |
| Sodium Sulfite | 50 g |
| Water | 10 liters |

When printing was conducted with the above obtained printing plate mounted on a Heidelberg GTO printing machine, 10,000 sheets of print were obtained which were sharp and stain-free.

While the invention has been described in detail and with reference to specific embodiments thereof, it will be apparent to one skilled in the art that various changes and modifications can be made therein without departing from the spirit and scope thereof.

What is claimed is:

1. In a process for producing a lithographic printing plate which comprises imagewise exposing a light-sensitive lithographic printing plate comprising a support with a hydrophilic surface having thereon a light sensitive layer containing an organic solvent-soluble, substantially water-insoluble light sensitive diazo resin which is a reaction product of a water-soluble diazo resin with an aromatic or aliphatic compound containing one or more phenolic hydroxy groups or sulfonic acid groups or both of said groups, said water-soluble diazo resin being a condensate of a diphenylamine p-diazonium salt with aldol, acetal or formaldehyde and a hydrophobic resin selected from the group consisting of epoxy resins, polyamide resins, polyvinyl halides, acetal resins, butyral resins, soluble urethane resins, polystyrene-maleic anhydride copolymers, half esters and half amides thereof, cellulose derivatives, shellac, rosin, modified rosin, acrylic acid-acrylate copolymers, copolymers of hydroxyalkyl acrylate or methacrylate and acrylonitrile, methacrylonitrile copolymers, mathacrylic acid copolymers, and mixtures thereof and treating the imagewise exposed lithographic printing plate with a developer composition to remove the unexposed areas, the improvement which comprises using a developer composition consisting essentially of an aqueous solution containing (a) benzyl alcohol, α-methylbenzyl alcohol, ethylene glycol monophenyl ether and/or glycol monobenzyl ether in an amount of about 0.2 to about 15% by weight, (b) an anionic surface active agent selected from the group consisting of salts of higher alcohol sulfuric acid esters, salts of aliphatic alcohol phosphoric acid esters, alkylaryl sulfonic acid salts, sulfonic acid salts of alkylamides, and sulfonic acid salts of carboxylic aliphatic acid esters in an amount of about 0.1 to about 5% by weight, and (c) a water-soluble alkali metal or alkaline earth metal sulfite in an amount of about 0.05 to about 3% by weight.

2. The process according to claim 1, wherein the anionic surface active agent (b) is isopropylnaphthylene sulfonate.

3. The process according to claim 1, wherein the water-soluble sulfite (c) is selected from the group consisting of sodium sulfite, potassium sulfite, lithium sulfite and magnesium sulfite.

4. The process according to claim 3, wherein the water-soluble sulfite (c) is sodium sulfite.

5. The process according to claim 1, wherein said benzyl alcohol, α-methylbenzyl alcohol, ethylene glycol monophenyl ether and/or ethylene glycol monobenzyl ether (a) is benzyl alcohol and said water-soluble sulfite (c) is sodium sulfite.

6. The process of claim 1, wherein said light-sensitive diazo resin is the reaction product of said water-soluble diazo resin and said aromatic compound.

7. The process of claim 1, wherein said light-sensitive diazo resin is the reaction product of said water-soluble diazo resin and said aliphatic compound.

8. The process of claim 6, wherein said water-soluble sulfite is an alkali metal or alkaline earth metal sulfite.

9. In a process for producing a lithographic printing plate which comprises imagewise exposing a light-sensitive lithographic printing plate comprising a support with a hydrophilic surface having thereon a light sensitive layer containing an organic solvent-soluble, substantially water-insoluble light sensitive diazo resin which is a reaction product of a water-soluble diazo resin with an aromatic or aliphatic compound containing one or more phenolic hydroxy groups or sulfonic acid groups or both of said groups, said water-soluble diazo resin being a condensate of a diphenylamine p-diazonium salt with aldol, acetal or formaldehyde and a hydrophobic resin selected from the group consisting of epoxy resins, polyamide resins, polyvinyl halides, acetal resins, butyral resins, soluble urethane resins, polystyrene-maleic anhydride copolymers, half esters and half amides thereof, cellulose derivatives, shellac, rosin, modified rosin, acrylic acid-acrylate copolymers, copolymers of hydroxyalkyl acrylate or methacrylate and acrylonitrile, methacrylonitrile copolymers, methacrylic acid copolymers, and mixtures thereof and treating the imagewise exposed lithographic printing plate with a developer composition to remove the unexposed areas, the improvement which comprises using a developer composition consisting essentially of an aqueous solution containing (a) benzyl alcohol, α-methylbenzyl alcohol, ethylene glycol monophenyl ether and/or glycol monobenzyl ether in an amount of about 0.5 to about 15% by weight, (b) an anionic surface active agent selected from the group consisting of salts of higher alcohol sulfuric acid esters, alkylaryl sulfonic acid salts, sulfonic acid salts of alkylamides, and sulfonic acid salts of carboxylic aliphatic acid esters in an amount of about 0.1 to about 5% by weight, (c) a water-soluble sulfite in an amount of about 0.05 to about 3% by weight, and (d) an alkali agent in an amount of about 0.05 to about 3% by weight.

10. The process of claim 9, wherein said developer is used in a pH range of more than about 5.

11. The process of claim 9, wherein said alkali agent is an inorganic alkali agent.

12. The process of claim 11, wherein said inorganic alkali agent is selected from the group consisting of sodium silicate, potassium silicate, potassium hydroxide, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate and ammonium carbonate.

13. The process of claim 9, wherein said alkali agent is an organic alkali agent.

14. The process of claim 13, wherein said alkali agent is selected from the group consisting of mono-, di-, tri-ethanolamine, propanolamine and an organic ammonium silicate.

15. The process of claim 9, wherein the treating with the developer composition is at a development temperature of from about 5° to about 80° C.

16. In a process for producing a lithographic printing plate which comprises imagewise exposing a light-sensitive lithographic printing plate comprising a support with a hydrophilic surface having thereon a light sensitive layer containing an organic solvent-soluble, substantially water-insoluble light sensitive diazo resin which is a reaction product of a water-soluble diazo resin with an aromatic or aliphatic compound containing one or more phenolic hydroxy groups or sulfonic acid groups or both of said groups, said water-soluble diazo resin being a condensate of a diphenylamine p-diazonium salt with aldol, acetal or formaldehyde and a hydrophobic resin selected from the group consisting of epoxy resins, polyamide resins, polyvinyl halides, acetal resins, butyral resins, soluble urethane resins, polystyrene-maleic anhydride copolymers, half esters and half amides thereof, cellulose derivatives, shellac, rosin, modified rosin, acrylic acid-acrylate copolymers, copolymers of hydroxyalkyl acrylate or methacrylate and acrylonitrile, methacrylonitrile copolymers, methacrylic acid copolymers, and mixtures thereof and treating the imagewise exposed lithographic printing plate with a developer composition to remove the unexposed areas, the improvement which comprises using a developer composition consisting of an aqueous solution containing (a) benzyl alcohol, α-methylbenzyl alcohol, ethylene glycol monophenyl ether and/or glycol monobenzyl ether in an amount of about 0.5 to about 15% by weight, (b) an anionic surface active agent selected from the group consisting of salts of higher alcohol sulfuric acid esters, alkylaryl sulfonic acid salts, sulfonic acid salts of alkylamides, and sulfonic acid salts of carboxylic aliphatic acid esters in an amount of about 0.1 to about 5% by weight, (c) a water-soluble sulfite in an amount of about 0.05 to about 3% by weight, and (d) an alkali agent in an amount of about 0.05 to about 3% by weight.

17. The process of claim 16, wherein said water-soluble sulfite is an alkali metal or alkaline earth metal sulfite.

18. The process of claim 16, wherein said developer is used in a pH range of more than about 5.

19. The process of claim 16, wherein said alkali agent is an inorganic alkali agent.

20. The process of claim 19, wherein said inorganic alkali agent is selected from the group consisting of sodium silicate, potassium silicate, potassium hydroxide, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate and ammonium carbonate.

21. The process of claim 16, wherein said alkali agent is an organic alkali agent.

22. The process of claim 21, wherein said alkali agent is selected from the group consisting of mono-, di-, tri-ethanolamine, propanolamine and an organic ammonium silicate.

23. The process of claim 16, wherein the treating with the developer composition is at a development temperature of from about 5° to 80° C.

* * * * *